United States Patent
Chase et al.

(10) Patent No.: US 8,698,372 B2
(45) Date of Patent: Apr. 15, 2014

(54) PYROELECTRIC POWER FROM TURBULENT AIRFLOW

(75) Inventors: Charles Chase, Lancaster, CA (US); Matthew Evans, Lancaster, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 281 days.

(21) Appl. No.: 13/151,213

(22) Filed: Jun. 1, 2011

(65) Prior Publication Data
US 2012/0306318 A1 Dec. 6, 2012

(51) Int. Cl.
*H01L 37/02* (2006.01)

(52) U.S. Cl.
CPC ........................... *H01L 37/02* (2013.01)
USPC ................................................ 310/306

(58) Field of Classification Search
CPC ............................................. H01L 37/02
USPC .................................... 310/306, 339
See application file for complete search history.

(56) References Cited

U.S. PATENT DOCUMENTS

| 4,706,069 A | 11/1987 | Tom et al. |
| 5,446,334 A | 8/1995 | Gaffney |
| 5,477,734 A | 12/1995 | Zemel et al. |
| 2008/0277941 A1 * | 11/2008 | Bowles et al. .................. 290/54 |
| 2009/0189012 A1 | 7/2009 | Liggett |
| 2012/0056504 A1 * | 3/2012 | Hunter et al. ................. 310/306 |

OTHER PUBLICATIONS

J. Xie et al., "Performance of Thin Piezoelectric Materials for Pyroelectric Energy Harvesting", Journal of Intelligent Material Systems and Structures, Feb. 2010, vol. 21.
"Energy Harvesting from Pyroelectricity and Piezoelectricity", Universitat Politecnica Catalunya (UPC), Spain.
Gael Sebald et al., "Pyroelectric Energy Conversion: Optimization Principles", IEEE Transactions on Ultrasonics, Ferroelectrics, and Frequency Control, Mar. 2008, vol. 55, No. 3.
Gael Sebald et al., "On Thermoelectric and Pyroelectric Energy Harvesting", Smart Materials and Structures, 2009, vol. 18, 125006, IOP.

* cited by examiner

*Primary Examiner* — Derek Rosenau
(74) *Attorney, Agent, or Firm* — McDermott Will & Emery LLP

(57) ABSTRACT

A power-generating device is disclosed that includes a pyroelectric material having first and second surfaces on opposite sides of the pyroelectric material. The device also includes a first conductive electrode coupled to a first support element that is configured to intermittently bring the first electrode into proximity with the first surface and a second conductive electrode proximate to the second surface at least while the first electrode is proximate to the first surface. The device also includes a power module that is electrically coupled between the first and second electrodes. The power module is configured to capture power from an electrical current flowing between the first and second electrodes.

26 Claims, 9 Drawing Sheets

PYROELECTRIC POWER FROM TURBULENT AIRFLOW

BACKGROUND

1. Field

The present disclosure generally relates to systems and methods of generating power from wind and, in particular, using pyroelectric materials to generate power from turbulent airflow.

2. Description of the Related Art

Traditional approaches to wind generation focus on capturing energy from steady wind flow, requiring turbine blades with large capture areas mounted far above the ground. Horizontal-axis wind turbines offer an efficient means to harvest energy from steady air flow. Moving air turns propeller blades, which in turn drive the shaft of an electrical generator. While all aspects of these turbines, from propeller aerodynamics to power conversion electronics, have been optimized over more than a century of development, several key limitations remain. The central challenge is that the efficiency of horizontal-axis designs is predicated on steady wind flow. Turning the propellers into the wind is necessary to take advantage of their optimized aerodynamics, and this yaw cannot happen arbitrarily quickly without inducing severe torques. In addition to steady air flow, the wind speed must exceed the "cut-in" velocity of the turbine to overcome the significant inertia associated with long propellers. Most horizontal-axis wind turbines have cut-in velocities around 4 m/s (10 mph).

Steady, high-speed wind requires turbines, for optimal power generation, to be placed as high as possible and far away from obstructions such as trees and buildings. In the United States, existing commercial wind farms are located in remote areas, such as the mountains around Tehachapi, Calif. or the major off-shore farm planned for the waters near Cape Cod, Mass. Delivering substantial amounts of power from these locations to populated areas requires a robust electrical grid and entails transmission and distribution losses of approximately 10%. The desire to harvest energy from weaker, less-directional winds near urban areas has spurred the development of vertical-axis wind turbines, which rotate about a central axis and can be driven by wind from any direction. These turbines sacrifice some of the efficiency of horizontal-axis systems, but in addition to being omni-directional, their reduced cut-in speeds permit operations in weaker winds. While attempts have been made to adapt both horizontal- and vertical-axis wind turbines to urban use, such systems must still be installed on the roofs of tall buildings to achieve even moderate conversion efficiencies. Few locations in built-up areas have steady wind flow in any direction, limiting the utility of traditional turbine systems.

SUMMARY

There is a need to capture the kilowatts of wind energy available from airflow over buildings, road overpasses, and other structures by conversion of turbulent flow with surface-mounted devices. The disclosed system provides a system and method for converting the energy of a low-velocity, turbulent air flow into electrical energy.

In certain embodiments, a power-generating device is disclosed that includes a pyroelectric material having first and second surfaces on opposite sides. The power generating device also includes a first conductive electrode coupled to a first support element configured to intermittently bring the first electrode into proximity with the first surface and a second conductive electrode proximate to the second surface at least while the first electrode is proximate to the first surface. The power generating device also includes a power module electrically coupled between the first and second electrodes, the power module configured to capture power from an electrical current flowing between the first and second electrodes.

In certain embodiments, a wind-power generator is disclosed that includes a structured surface configured to generate pressure oscillations in air flowing over the structured surface and at least one power-generating device coupled to the structured surface. The power-generating device includes a pyroelectric material having first and second surfaces on opposite sides, a first conductive electrode coupled to a first support element configured to intermittently bring the first electrode into proximity with the first surface, a second conductive electrode proximate to the second surface at least while the first electrode is proximate to the first surface, and a power module electrically coupled between the first and second electrodes. The power module is configured to capture power from an electrical current flowing between the first and second electrodes.

In certain embodiments, a method of extracting power from an airflow is disclosed. The method includes the steps of creating pressure oscillations in an air flow, wherein each oscillation has a higher-pressure portion and a lower-pressure portion, and allowing the higher pressure portion of the pressure oscillation to deform a first elastic support that is coupled to a first conductive electrode so as to bring the first electrode into proximity with a first surface of a pyroelectric material. The method also includes the step of placing a second conductive electrode in proximity with a second surface of the pyroelectric material at least while the first electrode is proximate to the first surface. The second surface is on the opposite side of the first surface. The method also includes the steps of capturing power from a flow of electrical charges from one of the first and second electrodes toward the other of the first and second electrodes, allowing the first elastic support to rebound during the lower pressure portion of the pressure oscillation so as to remove the first electrode from proximity with the first surface of the pyroelectric material, and capturing power from a flow of electrical charges from one of the first and second electrodes toward the other of the first and second electrodes.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

Figure 1:
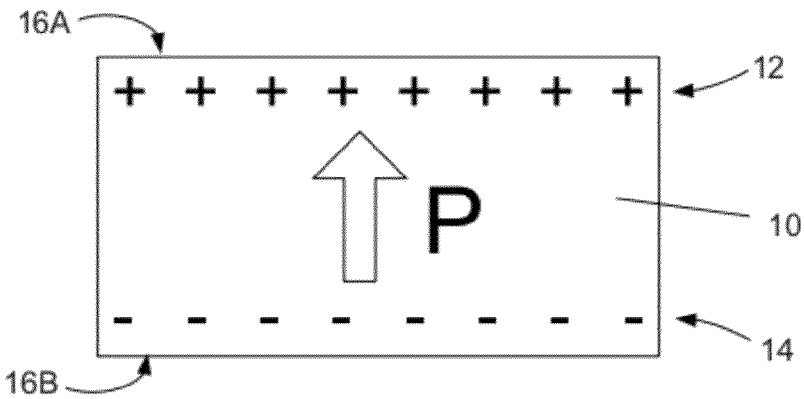
FIG. 1 is a cross-section of a pyroelectric material.

Many urban areas see average winds in the 9-14 mph range, providing kinetic energy of approximately 50 W/m². The flow around buildings, however, is turbulent, with local wind speeds and directions bearing little relation to the free-stream wind velocity away from the structure. Regions of heavy turbulence exist on both the windward side of the building and on the roof. A traditional turbine must be mounted high enough on the roof to reach the steady flow region. Devices that directly harvest the energy in the turbulent flow, however, could be mounted flush with the building's sides and roof. Such winds are more constant than strong, steady breezes, and thus little energy storage will be needed to provide a consistent source of power. Surface panels for wind energy harvesting are compatible with existing buildings. By generating electricity from wind in populated areas, the load on the electrical grid and losses from transmission are less than for off-shore and remote-area wind farms.

The following description discloses embodiments of a power generating system configured for use on the surfaces of structures such as building and road overpasses. The structured surface (on the scale of inches) acts as a cavity to set up concentrated pressure oscillations that cause vibration of electrodes of the power generator. The vibrating electrodes are set above a pyroelectric material, whose static electric polarization converts motion of the vibrating element into an alternating current (AC) flow of electricity. The surface structure adds structure to the random, turbulent fluctuations in the boundary layer and increases the magnitude of electrode vibrations excited by the airflow around the building. Up to 24 kilowatt (kW) of kinetic energy is available from turbulent fluctuations in the boundary layer of a 6400 ft² roof subject to a 10 mph breeze.

In the following detailed description, numerous specific details are set forth to provide a full understanding of the present disclosure. It will be apparent, however, to one ordinarily skilled in the art that embodiments of the present disclosure may be practiced without some of the specific details. In other instances, well-known structures and techniques have not been shown in detail so as not to obscure the disclosure.

The method and system disclosed herein are presented in terms of a power generator configured for use on the rooftop of a building. It will be obvious to those of ordinary skill in the art that this same configuration and method can be utilized in a variety of applications wherein there is low-velocity or turbulent air flow and it is desired to capture some of this wind energy as electric power. For example, power can also be generated from the turbulent airflow over wings, especially in regions where the airflow has separated. Nothing in this disclosure should be interpreted, unless specifically stated as such, to limit the application of any method or system disclosed herein to a rooftop or building.

FIG. 1 is a cross-section of a pyroelectric material 10. Pyroelectric materials, such as $LiTaO_3$, $LiNbO_3$, and triglycine sulfate, have a static polarization P that induces a permanent surface charge (electric dipole moment) that changes with the material temperature. In certain embodiments, the pyroelectric material is formed into a sheet. In certain embodiments, the pyroelectric material is formed such that the crystals of the pyroelectric material are aligned with the surfaces 16A, 16B of the sheet. As the pyroelectric material 10 is cooled or heated, positive charges 12 and negative charges 14 migrate to the opposite sides of the crystals of the pyroelectric material 10, creating an electric potential field similar to a self-charging capacitor. In certain embodiments, the crystals of the pyroelectric material 10 are aligned such that the positive charges 12 and negative charges 14 migrate to the opposite surfaces 16A, 16B, respectively, of the sheet of the pyroelectric material 10.

Figure 2A:
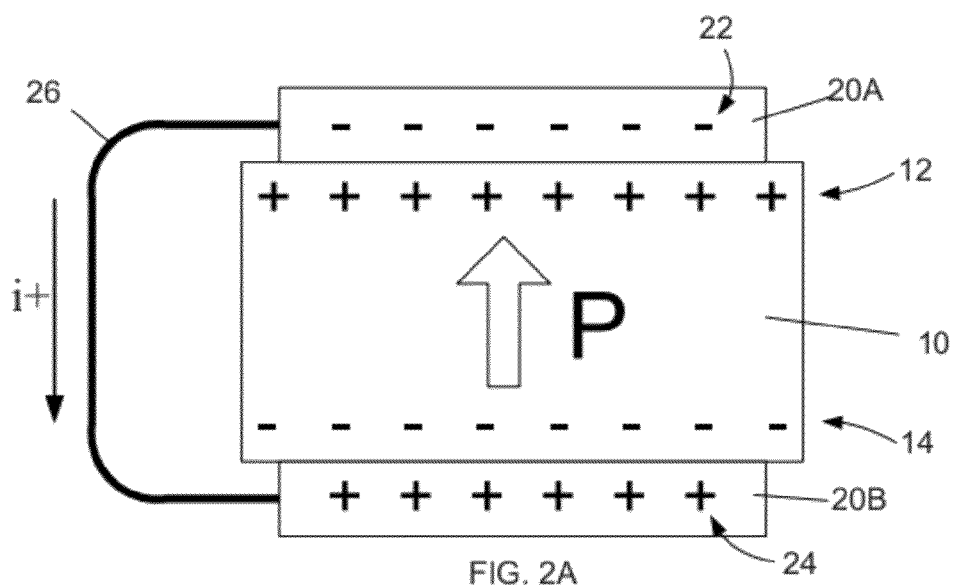
FIGS. 2A and 2B are cross-sections that illustrate a pair of electrodes that are proximate to the surfaces of the pyroelectric material of FIG. 1 according to certain aspects of this disclosure.
Figure 2B:
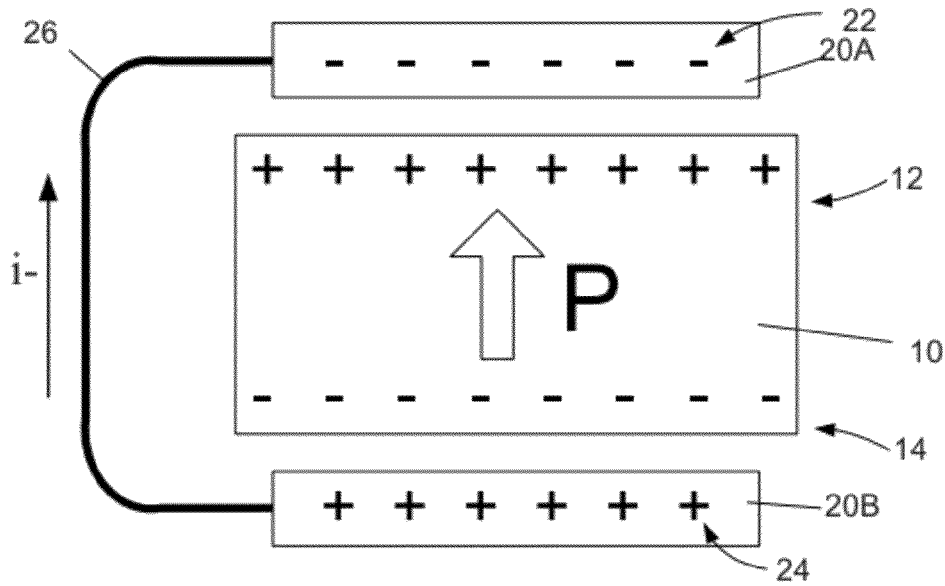

FIGS. 2A and 2B are cross-sections that illustrate a pair of electrodes 20A and 20B that are proximate to the surfaces 16A and 16B, respectively, that are on opposite sides of the pyroelectric material 10 of FIG. 1 according to certain aspects of this disclosure. FIG. 2A depicts a first step in the energy generation process, wherein the electrodes 20A, 20B are brought into close proximity with the surfaces 16A, 16B of the pyroelectric material 10. In certain embodiments, one of the electrodes 20A, 20B is in contact with the respective surface 16A, 16B. The surfaces 16A, 16B are bare crystal, i.e. they do not have a conductive coating, and cannot retain charges to neutralize its ferroelectric polarization. The pyroelectric material 10 therefore acts like a free dipole. Touching electrodes 20A, 20B to the crystal of the surfaces 16A, 16B generates a current i+ in the wire 26 that connects the electrodes 20A, 20B as the electrons in the electrodes 20A, 20B and wire 26 rearrange themselves in response to the surface charges 12, 14 created by the dipole moment, thereby creating charges 22 and 24 in electrodes 20A and 20B, respectively. Current i+ flows between electrodes 20A, 20B momentarily to neutralize the surface charges 12, 14. This transient current i+ ends when the charges 22, 24 are equal in magnitude to the charges 12, 14 in the pyroelectric material 10.

FIG. 2B depicts a second step in the energy generation process, wherein the electrodes 20A, 20B are moved away from the surfaces 16A, 16B sufficiently far that the surface charges 12, 14 no longer are interacting with the electrodes 20A, 20B. Without the influence of the surface charges 12, 14, the charges 22, 24 are free to flow towards each other. A second current i−, that is opposite in direction to the first current i+, flow momentarily as these charges 22,24 are neutralized. This transient current i− ends when the electrodes 20A, 20B both have zero charge.

It can be seen that as a system moves between the configurations of FIGS. 2A and 2B, currents i+ and i− will alternately flow through wire 26. The energy required to move the electrodes 20A, 20B into proximity with the charged surfaces 16A, 16B of pyroelectric material 10 can be provided by oscillations in air pressure of turbulent air, as in discussed in more detail with respect to later figures. In certain embodiments, only one of the electrodes 20A, 20B moves with respect to the pyroelectric material, with the other of the electrodes 20A, 20B remaining in proximity to the respective surface 16A, 16B. The tapping of an electrode 20A, 20B on the respective surface 16A, 16B of a pyroelectric crystal 10 to generate an AC current i+ and i− provides a means for mechanical-to-electrical energy conversion. Although the effect of converting forces to electricity is similar to the piezoelectric effect, the high surface charge of pyroelectric materials 10 makes the tapping process generate currents i+ and i− that are two orders of magnitude larger than those generated by piezoelectric materials.

Figure 3A:
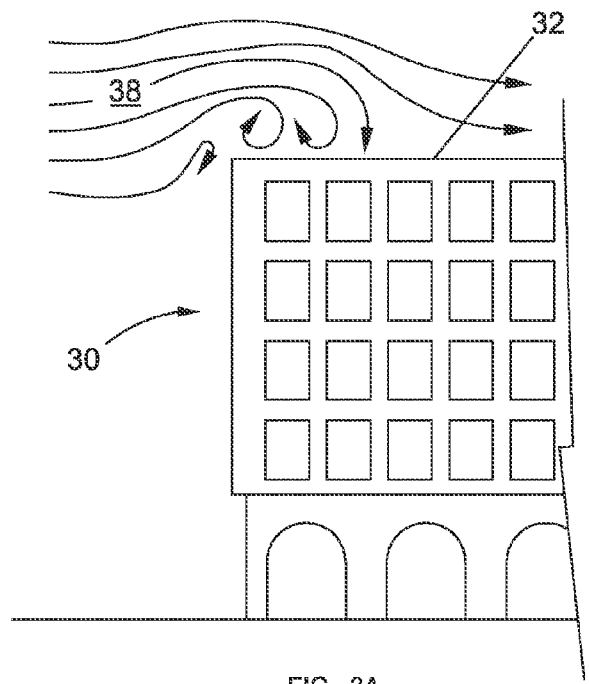
FIGS. 3A-3C illustrate the air flow behavior around an example building according to certain aspects of this disclosure.
Figure 3B:
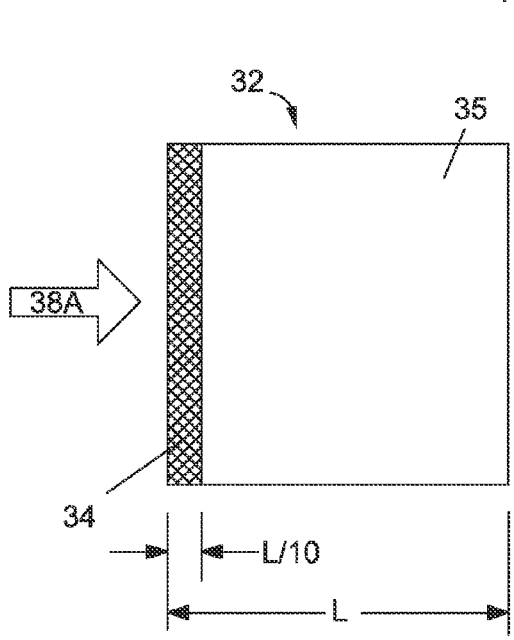
Figure 3C:
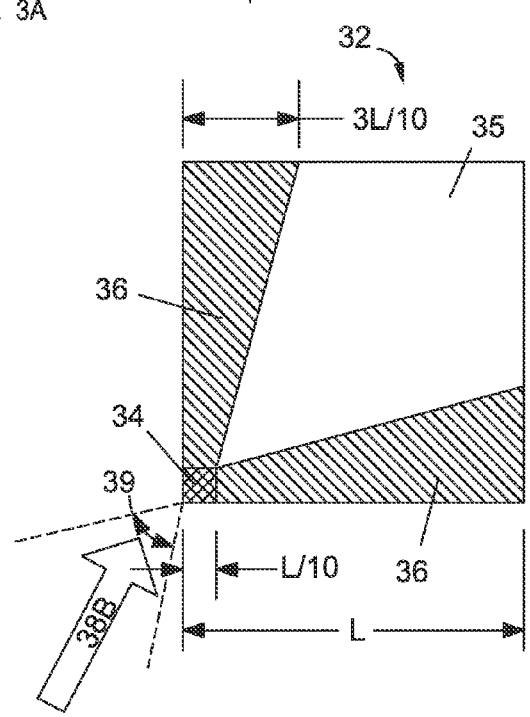

FIGS. 3A-3C illustrate the air flow behavior around an example building 30 according to certain aspects of this disclosure. Air flow 38 will typically develop turbulence as it flows over a building 30 as the portion of the air flow 38 that is blocked by the building 30 rises up and interacts with the higher-level air flow 38, creating turbulence on both the windward side of the building 30 and on the roof 32. Computational Fluid Dynamics (CFD) simulations, wind tunnel measurements on models, and full-scale measurements on instrumented buildings have all been used to quantify magnitudes, spatial, and temporal fluctuations of turbulent boundary layer pressure. The magnitude and frequency spectrum of these fluctuations has been found to scale with building height and wind velocity, making these studies relevant for buildings subject to gale-force winds as well as the gentle breezes in which pyroelectric panels are designed to operate.

To estimate the energy available to the pyroelectric surface panels, it is first necessary to know the magnitude of the pressure fluctuations. The magnitude scales with the wind velocity, and is generally expressed as a pressure coefficient Cp:

$$C_p = \frac{P - P_0}{1/2 \rho v^2} = \frac{\Delta P}{KE} \quad (1)$$

where:
P is the pressure
$P_o$ is the ambient pressure
$\rho$ is the air density
v is the wind velocity
$\Delta P$ is the pressure fluctuation relative to the wind's kinetic energy density (KE)

The pressure coefficient can also be expressed as a pressure fluctuation ($\Delta P$) relative to the wind's kinetic energy density (KE).

In a turbulent boundary layer, Cp varies considerably over the roof 32 and depends strongly on the direction of the wind 38 relative to the building 30. To calculate the power available from the turbulent flow in the boundary layer, it is necessary to know the frequency spectrum of pressure oscillations in addition to the root mean square pressure fluctuation. A pressure oscillation p in a volume of air V at a single frequency f provides a power of pVf during a half-cycle of the pressure wave. An un-damped cavity coupled to the fluctuating pressure will absorb energy (½)pV during a half-cycle, and then return (½)pV back to the air on the following half-cycle. A damped cavity, however, will convert the absorbed energy into heat or electrical power (in the case of the pyroelectric cavity), and thus absorb a net power of (½)pVf [the energy (½)pV in a half-cycle with time 1/f]. The total power $P_{tot}$ absorbed by the cavity given the pressure spectrum p(f) (power per unit frequency) is show in Equation 1.

$$P_{tot} = \frac{1}{2} V \int_0^\infty df\, p(f) f \quad (2)$$

Like the pressure coefficient Cp, the frequency spectrum of pressure fluctuations follows an invariant functional form when the spectrum is normalized to the pressure variance (the root mean square pressure coefficient) and the frequency is normalized to a reduced frequency F=fh/v, where h is the building height and v is the wind velocity.

The generic functional form of the normalized pressure spectrum $s(f)/\sigma^2$ is show in Equation 2.

$$S(F)/\sigma^2 = a_1 exp(-c_1 F) + a_2 exp(-c_2 F) \quad (2)$$

The coefficients a and c depend on the wind azimuth angle for flat roofed buildings, but do not depend on the wind velocity, building height, or other parameters.

FIGS. 3B and 3C show the three regions 34, 36, and 35 of a flat roof, each of which has unique coefficients. For an air flow 38A incident at a right angle to the building 30, the strongest pressure oscillations are found in the windward edge of the building (region 34), with weaker oscillations on the leeward side and edges of the building (region 35). Coefficients for the three regions are listed in table 1.

TABLE 1

|  | $a_1$ | $a_2$ | $c_1$ | $c_2$ |
| --- | --- | --- | --- | --- |
| Region 34 | 0.009756 | 0.01956 | 0.009725 | 0.1652 |
| Region 36 | 0.01207 | 0.1161 | 0.01977 | 0.3015 |
| Region 35 | 0.008162 | 0.1205 | 0.01084 | 0.3823 |

For a 9m (30 ft) tall building with a 5 m/s (10 mph) wind incident at a right angle to the building's face (0° in FIG. 5), fluctuations in region 34 provide the bulk of the power at low frequencies. Region 35 contributes proportionally greater power at high frequencies, up to approximately 100 Hz. The total power density in Region 35 is 450 W/m³, while that in region 34 is 140 W/m³.

The relevant volume of air is the air over the roof of the building 30 in the boundary layer that separates the roof surface 32 from the steady airflow 38 above. Based on a flat-plate model and the 5 m/s wind velocity, the average boundary layer thickness over the roof 32 will be approximately 20 cm (8 in). An 24m×24m roof (80 ft by 80 ft) will thus provide 115 m³ (4267 ft³) of air volume in the boundary layer. 10% of the surface area will be in region 34, and 90% in region 35. As a result, the total power available to an energy harvesting system on the roof of building 30 is 24 kW. This is an estimate of the maximum available power since, for some buildings and incident wind directions, the root mean square pressure coefficient is likely to be less than 0.3 on the leeward side of the building 30.

FIG. 3B shows an illustrative roof 32 wherein the airflow 38A is incident at an approximately right angle to the building 30. Region 34 is approximately 10% of the roof length L, stretching across the width of the roof 32. The rest of the roof 32 is part of region 35.

FIG. 3C shows an illustrative roof 32 wherein the airflow 38B is incident at an angle within a range 39 that is 15-75 degrees to the building 30. Region 34 is restricted to the corner of the building and is approximately 10% of the roof dimension L in both length and width (roof 32 is approximately square in FIG. 3C). A region 36 forms along the two edges of the building that the air flow 38B strikes, the regions 36 tapering outward from region 34 to a maximum width of 3L/10. The rest of the roof 32 is part of region 35.

Figure 4A:
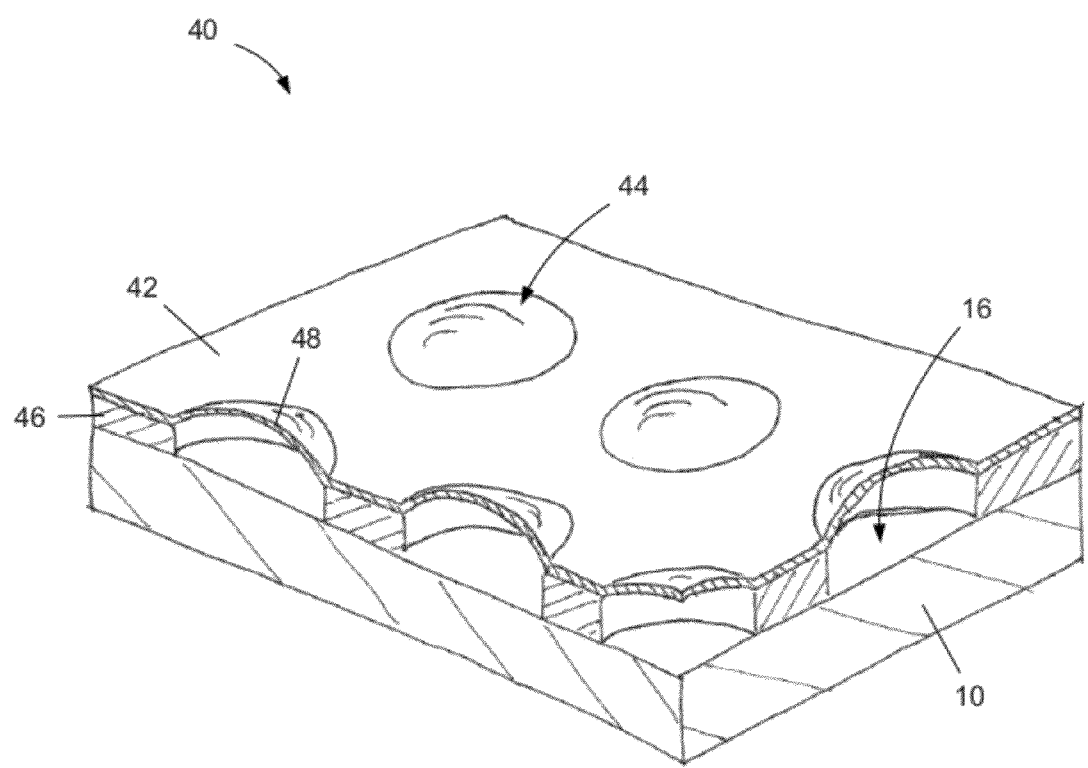
FIG. 4A is a perspective view of an embodiment of a power generating system according to certain aspects of this disclosure.

FIG. 4A is a perspective view of an embodiment of a power generating system 40 according to certain aspects of this disclosure. In this embodiment, a sheet of pyroelectric material 10 is coated on one side with an insulator 46 having a series of holes spaced across the surface 16 of the pyroelectric material 10. A flexible electrode 42 covers the insulator 46 with membranes domes 48 formed in the flexible electrode 42 over the holes in the insulator 46, thereby forming a grid of power generator devices 44.

Figure 4B:
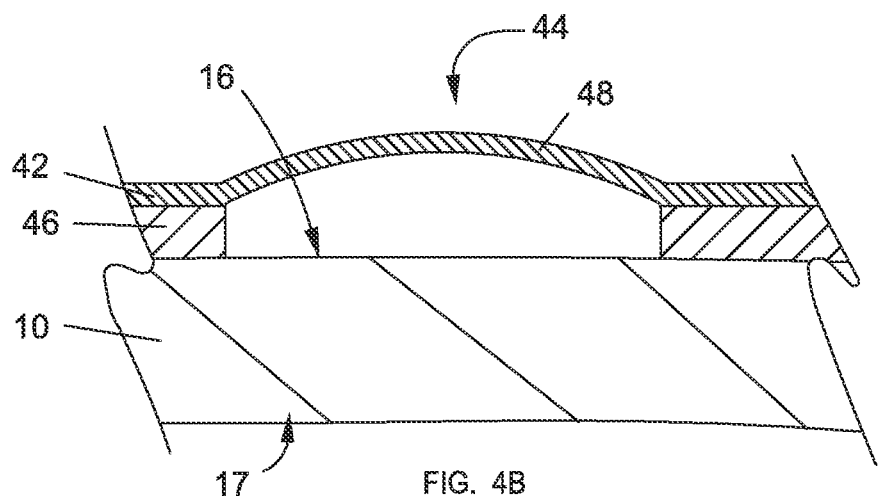
FIGS. 4B and 4C are cross-sections of a power generating device of FIG. 4A according to certain aspects of this disclosure.
Figure 4C:
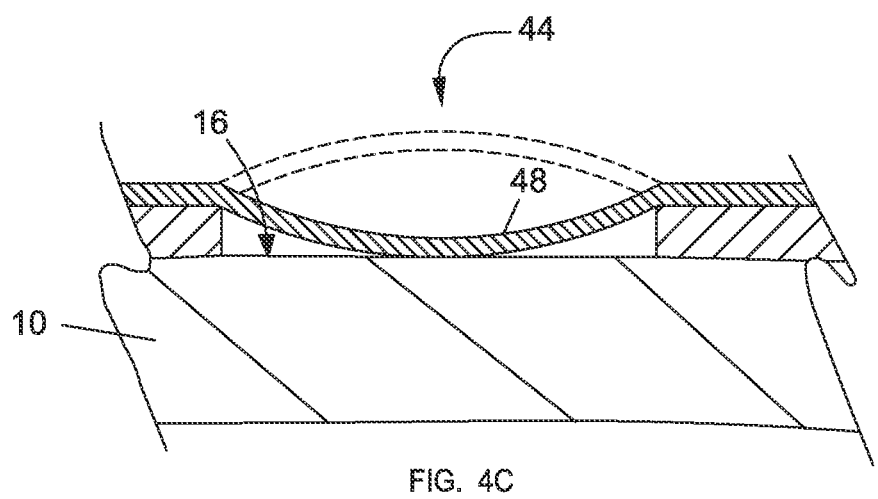

FIGS. 4B and 4C are cross-sections of a power generating device 44 of FIG. 4A according to certain aspects of this disclosure. The material properties of the flexible electrode 42 and the thickness and diameter of the membrane dome 48 are selected such that the pressure variations of the turbulent air flow 38 cause the membrane dome 48 to oscillate between the configurations of FIG. 4B and FIG. 4C. The thickness of the insulator 46 is chosen such that the membrane dome 48 is in proximity with the surface 16 of the pyroelectric material 10 when in the configuration of FIG. 4C. In certain embodiments, the membrane dome 48 contacts the surface 16 when in the configuration of FIG. 4C. A second electrode (not shown) is in proximity with the bottom surface 17 of pyroelectric material 10. In certain embodiments, the second electrode is in contact with the bottom surface 17.

Figure 5A:
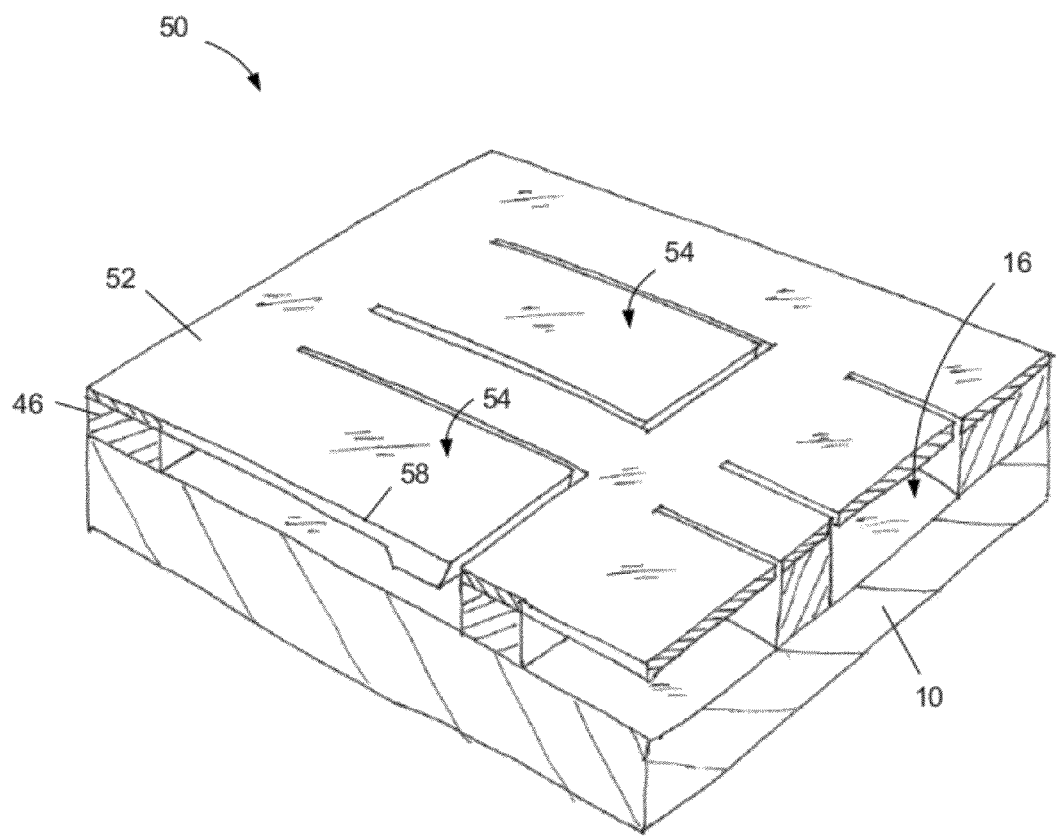
FIG. 5A is a perspective view of another embodiment of a power generating system according to certain aspects of this disclosure.

FIG. 5A is a perspective view of another embodiment of a power generating system 50 according to certain aspects of this disclosure. In this embodiment, a sheet of pyroelectric material 10 is coated on one side with an insulator 46 having a series of rectangular holes spaced across the surface 16 of the pyroelectric material 10. A flexible electrode 52 covers the insulator 46 with cantilevers 58 formed over the holes, thereby forming a grid of power generator devices 54. In this embodiment, each cantilever 58 is formed by cutting through the sheet of flexible electrode 52 on three sides of a rectangle, forming a cantilever extending from the fourth side over the hole in insulator 46.

Figure 5B:
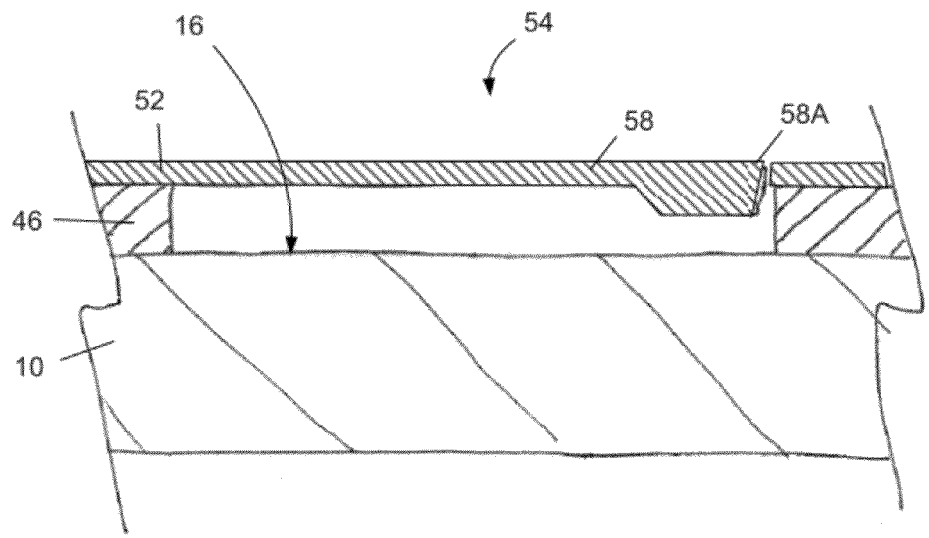
FIGS. 5B and 5C are cross-sections of a power generating device of FIG. 5A according to certain aspects of this disclosure.
Figure 5C:
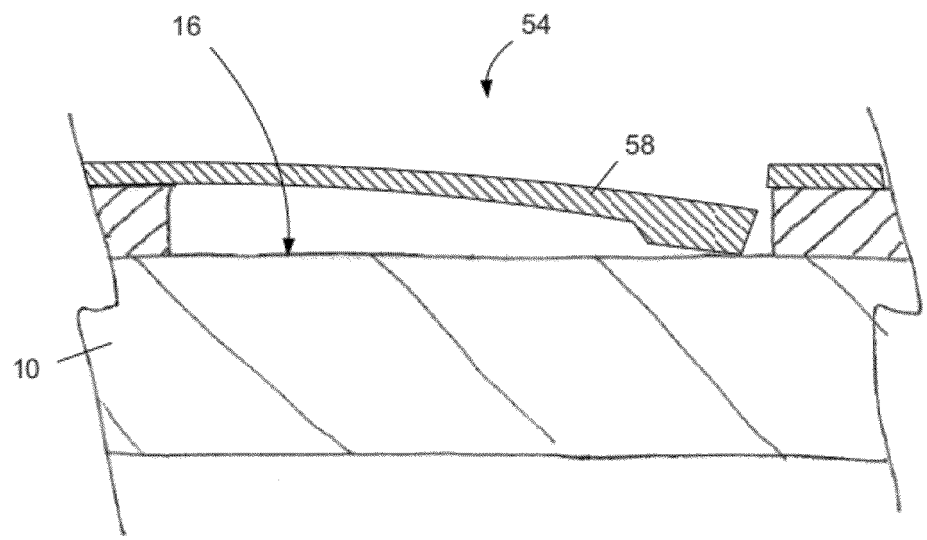

FIGS. 5B and 5C are cross-sections of a power generating device 54 of FIG. 5A according to certain aspects of this disclosure. The material properties and the thickness of the flexible electrode 52 and the width of the cantilever 58 are selected such that the pressure variations of the turbulent air flow 38 cause the cantilever 58 to oscillate between the configurations of FIG. 5B and FIG. 5C. In certain embodiments, the thickness of the flexible electrode 52 varies over the area of the cantilever 58. In certain embodiments, the flexible electrode 52 is thicker at the free end 58A of the cantilever 58 to adjust the resonant frequency of the cantilever 58. The thickness of the insulator 46 is chosen such that the free end 58A of the cantilever 58 is in proximity with the surface 16 of the pyroelectric material 10 when in the configuration of FIG. 5C. In certain embodiments, the free end 58A contacts the surface 16 when in the configuration of FIG. 5C. As for the power generating device of FIGS. 4A-4C, a second electrode (not shown) is in proximity with the bottom surface 17 of pyroelectric material 10. In certain embodiments, the second electrode is in contact with the bottom surface 17.

The fundamental principle behind pyroelectric wind energy harvesting is that turbulent airflow 38 will excite vibrations in a flexible electrode, such as membrane dome 48 or cantilever 58, that will then "tap" on the surface 16 of the pyroelectric crystal 10. This tapping, in the presence of the electric field from the permanent surface charge of the pyroelectric material 10, will drive a current in the wire 26 that connects the electrodes on the two surfaces of the pyroelectric material 10 and generate electrical power.

Figure 6A:
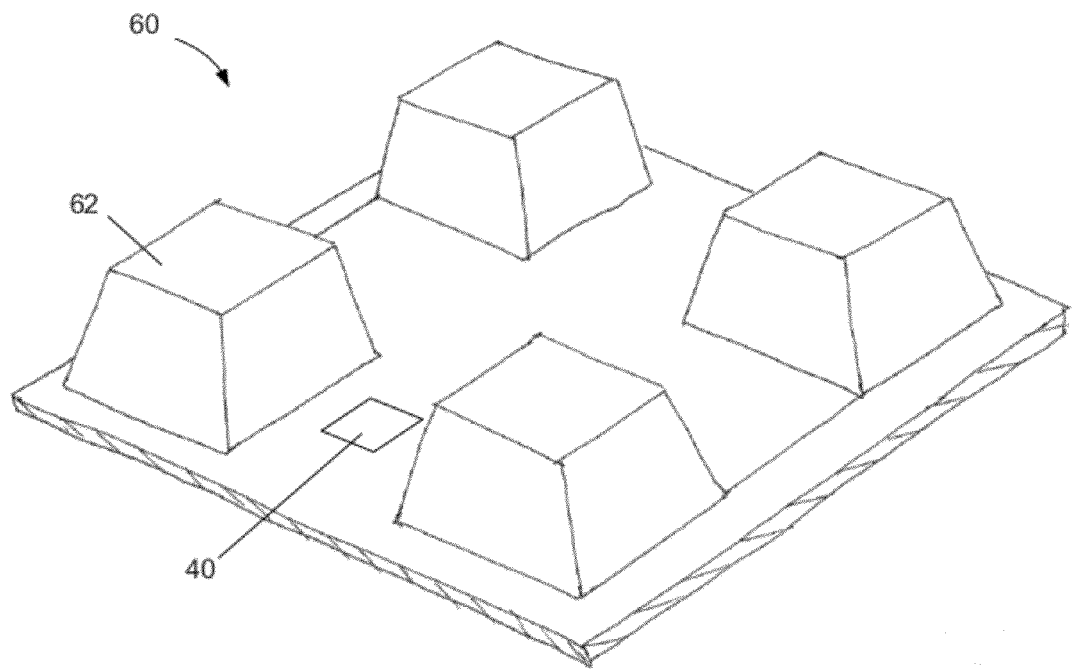
FIG. 6A is a perspective view of a structured surface according to certain aspects of this disclosure.

FIG. 6A is a perspective view of a structured surface 60 according to certain aspects of this disclosure. An example power generating system 40 is shown located between columnar structures 62 in an area where pressure variations are created by the columnar structures as described in more detail with respect to FIG. 6B. In certain embodiments, power generating systems are be located at other locations (not shown) between the columnar structures 62 where pressure variations occur. In certain embodiments, power generating systems are located on the columnar structures 62 (not shown).

Figure 6B:
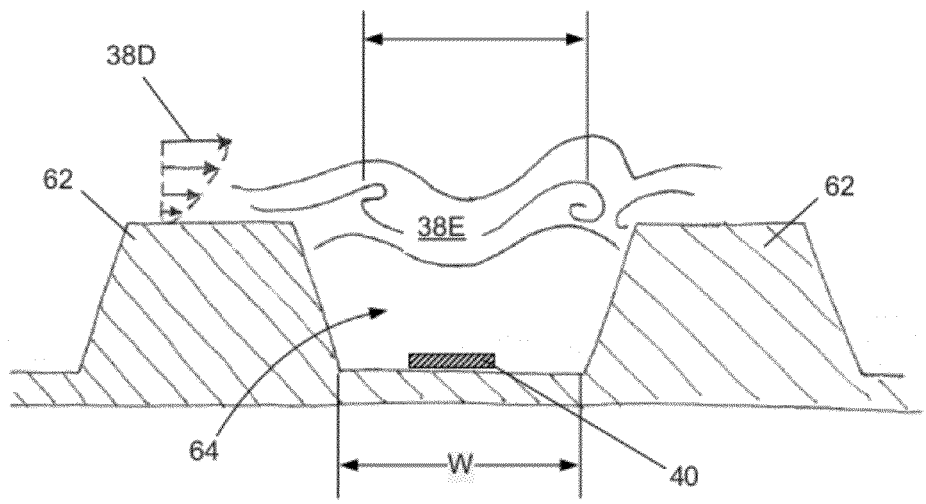
FIG. 6B is a cross-section of a portion of the structured surface of FIG. 6A according to certain aspects of this disclosure.

FIG. 6B is a cross-section of a portion of the structured surface 60 of FIG. 6A according to certain aspects of this disclosure. A cavity 64 is formed between the columnar structures 62 with a power generating system 40 on the bottom of the cavity 64. The pressure resonance of cavity 64 is excited by turbulent air flow 38E. Turbulent flow has power at all frequencies and length scales, making it possible to couple to cavities of all sizes. The Strouhal number ($S_t$), used to characterize oscillating flow, provides a guide to the coupling between free air flow and cavity modes as shown in Equation 3.

$$S_t = fW/v_{flow} \tag{3}$$

where:
  f is the cavity resonant frequency
  W is the width of the cavity 64
  $v_{flow}$ is the velocity of flow 38E
Cavity oscillations are most strongly excited when the cavity dimensions and air speed are such that $S_t$~0.5–1.0.

The majority of the available power in the boundary layer 38D is contained in fluctuations from 10-200 Hz. For a 5 m/s (10 mph) wind, this implies a range in cavity width W from 2-50 cm (approximately 1 in to 2 ft). This range in spacing can be created with a surface structured on multiple scales: from taller columnar structures 62 spaced 1-2 ft apart (such as shown in FIG. 6A) to the small scale structure of the pyroelectric power generators 40 and 50 of FIGS. 4A and 5A, respectively. The structured surface 60 of FIG. 6A allows the pyroelectric power generator 40, 50 to capture power from a wide range of frequencies in turbulent air flow 38E.

Figure 7A:
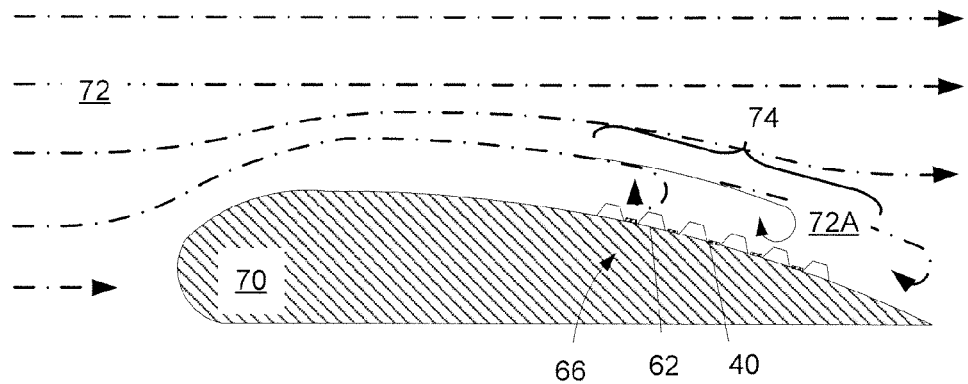
FIG. 7A is a cross-section of a wing equipped with a pyroelectric power generator according to certain aspects of this disclosure.

FIG. 7A is a cross-section of a wing 70 equipped with a pyroelectric power generator 66 according to certain aspects of this disclosure. Airflow 72 passing over certain wings 70 is known to have turbulent flow 72A over a portion 74 of the upper trailing surface. A pyroelectric power generator 66, in certain embodiments, is the structured surface 60 of FIG. 6A with columnar structures 62 and power generating systems 40. In FIG. 7A, a pyroelectric power generator 66 is located on the portion 74 of the wing 70 to capture energy from this turbulent air flow. In certain embodiments, pyroelectric power systems 66 are located on other portions of an airplane (not shown) in addition to wing 70. The balance between the power generated and the additional aerodynamic drag on the airplane should be considered when adding a pyroelectric power generator 66 to an airplane.

Figure 7B:
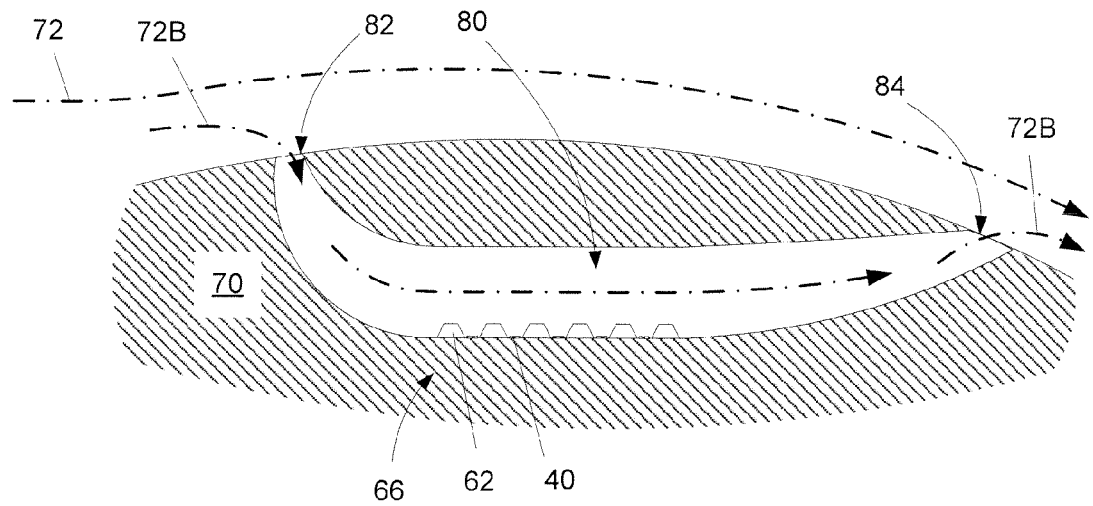
FIG. 7B is a enlarged cross-section of a portion of the wing of FIG. 7A depicting another pyroelectric power generator according to certain aspects of this disclosure.

FIG. 7B is a enlarged cross-section of a portion of the wing 70 of FIG. 7A depicting another pyroelectric power generator 66 according to certain aspects of this disclosure. In this embodiment, an entrance opening 82 and an exit opening 84 are located on the upper surface of wing 70. The static air pressure of the airflow 72 at the entrance opening 82 is higher than the static air pressure of the airflow 72 at the exit opening 84, thereby creating an airflow 72B into entrance opening 82 that passes through the internal passes 80 and out through exit opening 84. In this embodiment, a power generating system 66 having columnar structures 62 and power generating systems 40 is located within the passage 80. In certain embodiments, positionable elements (not shown) throttle the air flow 72B by one or more of adjusting the entrance opening 82 or the exit opening 84 or adjusting and flow controller (not shown) within passage 80. In certain embodiments, the entrance opening 82 is located at the leading edge of wing 70. In certain embodiments, the entrance and exit openings 82, 84 and passage 80 are located in other portions of the plane.

Figure 7C:
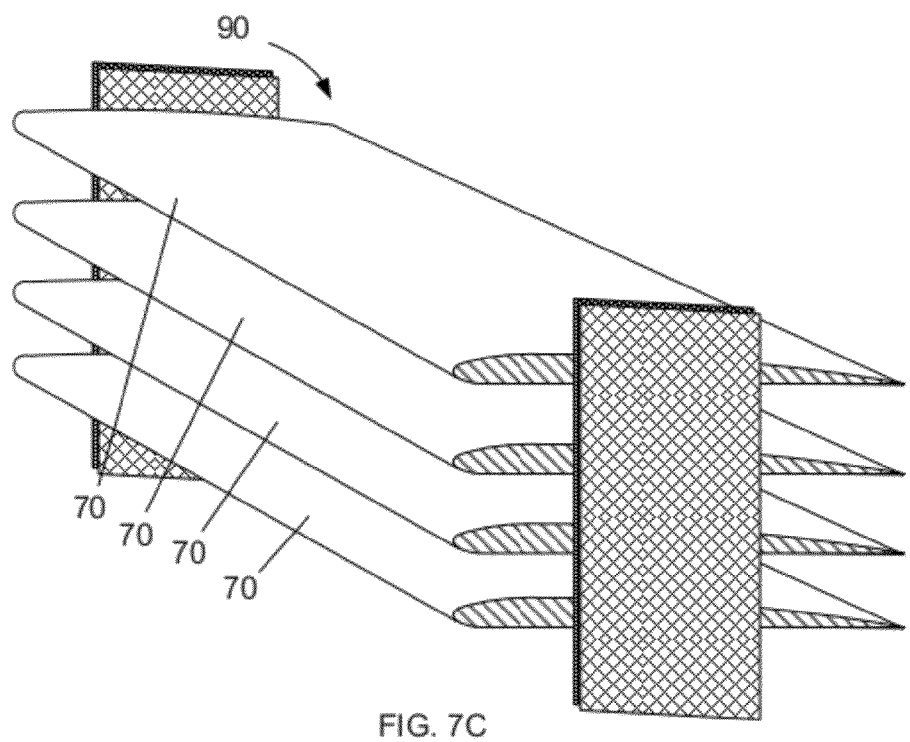
FIG. 7C depicts another power generating system that includes the wing of FIG. 7A according to certain aspects of this disclosure.

FIG. 7C depicts another power generating system 90 that includes the wing 70 of FIG. 7A according to certain aspects of this disclosure. Each wing 70 includes one or both of the power generating system 66 shown in FIGS. 7A and 7B. This system is ground-mounted, however, and the aerodynamic grad on the wings 70 is not a concern. In certain embodiments, the power generating system 90 is mounted on a rotating base (not shown) so as to be adjustable to face into the current prevailing wind. In certain embodiments, the power generating system 90 includes an aerodynamic rudder (not shown) that automatically rotates the base to face the wings 70 into the prevailing wind.

Figure 8:
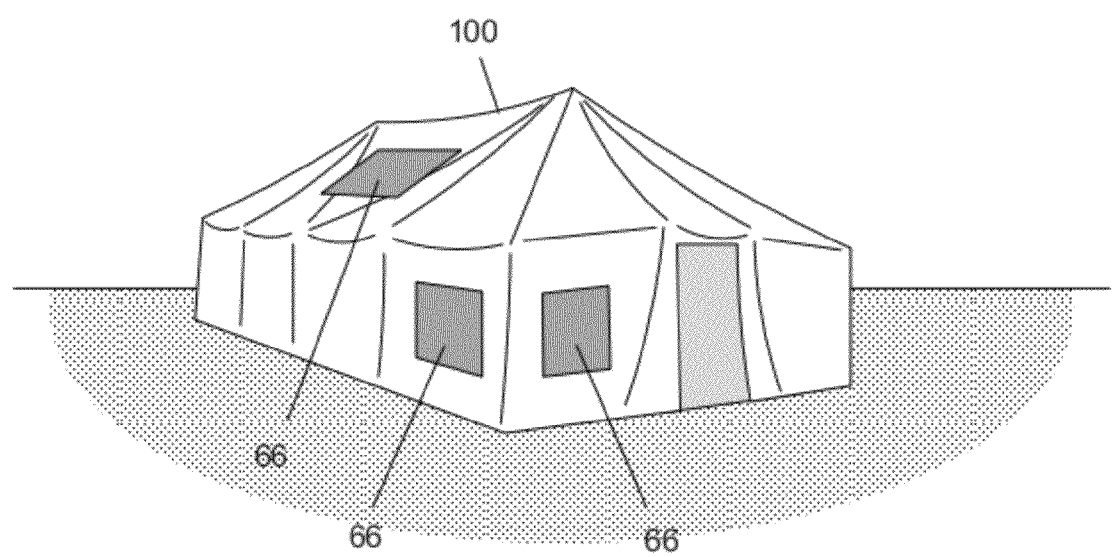
FIG. 8 depicts a tent equipped with pyroelectric power generators according to certain aspects of this disclosure.

FIG. 8 depicts a tent 100 equipped with pyroelectric power generators 66 according to certain aspects of this disclosure. Tents are often used in temporary living arrangements in areas that do not have available electric power. For an example of an 8-person tent approximately 15 ft×24 ft, the tent 100 has a total surface area of approximately 864 square feet or external surface. If this surface is covered with a pyroelectric power generator 66 that generates approximately 5 watts per square foot in a 10 mph breeze, the tent 100 generates 4.3 kilowatts of power. The additional weight of the structured surface 60 and power generators 40 for tent 100 is estimated to be 170 pounds. A portable electric generator of similar power output weighs approximately 190 pounds and requires approximately 1.3 gallons of fuel per hour to operate. In certain embodiments, portions of rigid temporary structures (not shown) are equipped with pyroelectric power generators 66. In certain embodiments, a flexible substate (not shown), for example a tarp, are equipped with pyroelectric power generators 66 such that the flexible substrate may be transported in a rolled-up configuration and deployed by unrolling across a support structure or simply unrolled on the ground. In certain embodiments, a portion of a vehicle storage cover (not shown) is covered with a pyroelectric power generator 66 to provide charging power to maintain the charge on the vehicle's batteries while stored.

The concepts disclosed herein provide a method of generating electrical power from turbulent air flow. The system and method disclosed herein include power generating devices configured to oscillate in response to the pressure variations of the turbulent air flow and intermittently come into proximity with a surface of a pyroelectric material. As the electrodes oscillate into and out of proximity with the surface of the pyroelectric material, alternating current is caused to flow through a circuit connecting electrodes on opposite faces of the pyroelectric material. A structured surface is also disclosed that generates turbulence having frequency components in a range that causes power generating devices to oscillate thereby generating power. Structures surfaces can be added to the surface or interior of aircraft wings or to the surface of portable structures intended for use in remote areas.

The previous description is provided to enable a person of ordinary skill in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the terms "a set" and "some" refer to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A power-generating device comprising:
 a pyroelectric material having first and second surfaces on opposite sides;
 a first conductive electrode coupled to a first support element configured to bend toward the first surface of the pyroelectric material and intermittently bring the first electrode into proximity with the first surface;

a second conductive electrode proximate to the second surface at least while the first electrode is proximate to the first surface; and a power module electrically coupled between the first and second electrodes, the power module configured to capture power from an electrical current flowing between the first and second electrodes.

2. The power-generating device of claim 1, wherein the first and second electrodes and power module are configured to allow the pyroelectric material to draw positive electrical charges to one of the first and second electrodes and draw negative electrical charges to the other of the first and second electrodes while the first and second electrodes are proximate to the pyroelectric material, and to allow one of the positive and negative electrical charges to flow from one of the first and second electrodes to the other of the first and second electrodes while at least one of the first and second electrodes are not proximate to the pyroelectric material.

3. The power-generating device of claim 1, wherein the first electrode makes intermittent contact with the first surface.

4. The power-generating device of claim 1, wherein the first support element comprises an elastically deformable element.

5. The power-generating device of claim 4, wherein the first support element is configured to oscillate when exposed to turbulent air flow such that the oscillations cause the first electrode to intermittently be in proximity with the first surface.

6. The power-generating device of claim 5, wherein the first support element is configured to oscillate when exposed to turbulent air flow having an average velocity of less than 4.5 meters per second.

7. The power-generating device of claim 5, wherein the first support element comprises a dome.

8. The power-generating device of claim 5, wherein the first support element comprises a cantilever arm.

9. The power-generating device of claim 4, further comprising a second elastically deformable support element coupled to the second electrode, the second support configured to intermittently bring the second electrode into proximity with the second surface synchronous with the first electrode being in proximity with the first surface.

10. A wind-power generator comprising:
a structured surface configured to generate pressure oscillations in air flowing over the structured surface; and
at least one power-generating device coupled to the structured surface, the power-generating device comprising:
a pyroelectric material having first and second surfaces on opposite sides;
a first conductive electrode coupled to a first support element configured to intermittently bring the first electrode into proximity with the first surface;
a second conductive electrode proximate to the second surface at least while the first electrode is proximate to the first surface; and
a power module electrically coupled between the first and second electrodes, the power module configured to capture power from an electrical current flowing between the first and second electrodes.

11. The wind-power generator of claim 10, wherein the structured surface is configured to generate pressure oscillations when the air flowing over the structured surface has an average velocity of less than 4.5 meters per second.

12. The wind-power generator of claim 10, wherein the structured surface is configured to generate pressure oscillations at a frequency within a range of 10-200 Hz.

13. The wind-power generator of claim 12, wherein the structured surface is configured to generate pressure oscillations at more than one frequency within a range of 10-200 Hz.

14. The wind-power generator of claim 10, wherein the structured surface has at least one first cavity.

15. The wind-power generator of claim 14, wherein the at least one first cavity has a first resonant frequency within a range of 10-200 Hz.

16. The wind-power generator of claim 15, wherein the structured surface has at least one second cavity having a second resonant frequency different from the first resonant frequency and within the range of 10-200 Hz.

17. The wind-power generator of claim 10, wherein the structured surface comprises a plurality of columnar structures configured to create pressure oscillations in wind flowing past the columnar structures.

18. The wind-power generator of claim 17, wherein the columnar structures are less than 20 cm in height.

19. The wind-power generator of claim 17, wherein the columnar structures are arranged in a regular rectangular array.

20. The wind-power generator of claim 10, wherein the structured surface and the at least one power-generating device are coupled to a surface of a wing.

21. The wind-power generator of claim 10, wherein:
the structured surface and the at least one power-generating device are disposed within a passage;
the passage comprises an entrance opening and an exit opening disposed at opposite ends of the passage; and
the entrance opening and exit opening are located so as to cause air to flow from the entrance opening through the passage to the exit opening.

22. The wind-power generator of claim 21, wherein:
the entrance opening is disposed at a first location having a first static air pressure on a surface of an aircraft wing; and
the exit opening is disposed at a second location having a second static air pressure on a surface of an aircraft wing, the second static air pressure being lower than the first static air pressure.

23. The wind-power generator of claim 10, wherein the structured surface and the at least one power-generating device are coupled to a flexible substrate.

24. A method of extracting power from an airflow, the method comprising the steps of:
placing a power-generating device pressure having a first elastic support coupled to a first conductive electrode and a pyroelectric material into a location over which an air flow passes, the airflow having pressure oscillations wherein each oscillation having a higher-pressure portion and a lower-pressure portion;
allowing the higher pressure portion of the pressure oscillation to deform the first elastic support so as to bring the first electrode into proximity with a first surface of the pyroelectric material;
placing a second conductive electrode in proximity with a second surface of the pyroelectric material at least while the first electrode is proximate to the first surface, the second surface on an opposite side of the first surface;
capturing power from a flow of electrical charges from one of the first and second electrodes toward the other of the first and second electrodes;
allowing the first elastic support to rebound during the lower pressure portion of the pressure oscillation so as to remove the first electrode from proximity with the first surface of the pyroelectric material; and capturing power from a flow of electrical charges from one of the first and second electrodes toward the other of the first and second electrodes.

25. The method of extracting power of claim 24, further comprising the steps of:

allowing the pyroelectric material to draw positive electrical charges to one of the first and second electrodes and draw negative electrical charges to the other of the first and second electrodes while both the first and second electrodes are proximate to the pyroelectric material; and allowing one of the positive and negative electrical charges to flow from one of the first and second electrodes to the other of the first and second electrodes while at least one of the first and second electrodes is not proximate to the pyroelectric material.

26. The method of extracting power of claim 24, wherein the step of placing a second conductive electrode in proximity with a second surface of the pyroelectric material comprises the steps of:

allowing the higher pressure portion of the pressure oscillation to deform a second elastic support that is coupled to the second electrode so as to bring the second electrode into proximity with the second surface of the pyroelectric material synchronously with the first electrode being in proximity with the first surface; and allowing the second elastic support to rebound during the lower pressure portion of the pressure oscillation so as to remove the second electrode from proximity with the second surface of the pyroelectric material.

* * * * *